(12) United States Patent
Dry (10) Patent No.: US 11,244,884 B2
(45) Date of Patent: Feb. 8, 2022

(54) SEMICONDUCTOR PACKAGE WITH FLOATING HEAT SPREADER AND PROCESS FOR MAKING THE SAME

(71) Applicant: Qorvo US, Inc., Greensboro, NC (US)

(72) Inventor: Robert Charles Dry, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/925,517

(22) Filed: Jul. 10, 2020

(65) Prior Publication Data
US 2020/0343157 A1   Oct. 29, 2020

Related U.S. Application Data

(62) Division of application No. 16/281,807, filed on Feb. 21, 2019, now Pat. No. 10,734,301.

(60) Provisional application No. 62/728,979, filed on Sep. 10, 2018.

(51) Int. Cl.
| | |
|---|---|
| *H01L 23/367* | (2006.01) |
| *H01L 23/31* | (2006.01) |
| *H01L 21/56* | (2006.01) |
| *H01L 23/29* | (2006.01) |

(52) U.S. Cl.
CPC ........ *H01L 23/3672* (2013.01); *H01L 21/563* (2013.01); *H01L 21/565* (2013.01); *H01L 23/298* (2013.01); *H01L 23/3185* (2013.01)

(58) Field of Classification Search
CPC ............. H01L 23/3672; H01L 23/3185; H01L 21/565; H01L 21/563; H01L 23/298; H01L 23/367; H01L 23/3121
See application file for complete search history.

(56) References Cited

U.S. PATENT DOCUMENTS

| | | | |
|---|---|---|---|
| 2010/0181644 A1* | 7/2010 | Toong ................... | H01L 24/73 257/532 |
| 2012/0119346 A1* | 5/2012 | Im ........................ | H01L 23/552 257/690 |
| 2015/0016064 A1* | 1/2015 | Yamamoto .......... | H01L 23/4334 361/719 |
| 2018/0166358 A1* | 6/2018 | Costa .................. | H01L 23/3135 |

(Continued)

OTHER PUBLICATIONS

Notice of Allowance for U.S. Appl. No. 16/281,807, dated Mar. 27, 2020, 9 pages.

*Primary Examiner* — Yasser A Abdelaziez
(74) *Attorney, Agent, or Firm* — Withrow & Terranova, P.L.L.C.

(57) ABSTRACT

The present disclosure relates to a semiconductor package, which includes a carrier, a flip-chip die, a mold compound, and a heat spreader. Herein, the flip-chip die includes a device layer over the carrier and a die substrate over the device layer. The mold compound resides over the carrier and surrounds the flip-chip die. The mold compound has a recess adjacent to the flip-chip die, and the recess extends vertically lower than a top surface of the die substrate. The heat spreader hangs over the flip-chip die, and includes a spreader body that is thermally coupled to the die substrate, and a spreader protrusion that extends from the spreader body into the recess. A thickness of the spreader protrusion is shorter than a depth of the recess, and a width of the spreader protrusion is narrower than a width of the recess, such that the spreader protrusion is floating in the recess.

15 Claims, 5 Drawing Sheets

(56) References Cited

U.S. PATENT DOCUMENTS

2019/0115269 A1 4/2019 Pan et al.
2019/0385931 A1 12/2019 Eid et al.
2020/0083136 A1 3/2020 Dry

* cited by examiner

SEMICONDUCTOR PACKAGE WITH FLOATING HEAT SPREADER AND PROCESS FOR MAKING THE SAME

RELATED APPLICATIONS

This application is a divisional of U.S. patent application Ser. No. 16/281,807, filed Feb. 21, 2019, now U.S. Pat. No. 10,734,301, which claims the benefit of provisional patent application Ser. No. 62/728,979, filed Sep. 10, 2018, the disclosures of which are hereby incorporated herein by reference in their entireties.

FIELD OF THE DISCLOSURE

The present disclosure relates to a semiconductor package and a process for making the same, and more particularly to a semiconductor package with a floating heat spreader for thermally enhanced performance, and a process for applying the floating heat spreader into the semiconductor package.

BACKGROUND

With the current popularity of portable communication devices and developed semiconductor fabrication technology, high speed and high performance transistors are more densely integrated on semiconductor dies. Consequently, the amount of heat generated by the semiconductor dies increases significantly due to the large number of transistors integrated on the semiconductor dies, the large amount of power passing through the transistors, and the high operation speed of the transistors. Accordingly, it is desirable to package the semiconductor dies in a configuration for better heat dissipation.

A conventional approach to enhance thermal performance of a package is to place a heat spreader directly over the semiconductor dies. However, the height variation of different dies makes it very difficult to directly connect the heat spreader with each semiconductor die. A compliant material might be applied to each die to eliminate the height variation. As such the heat spreader may make contact with each die. However, the compliant material used at the interface of each die typically has a relatively high thermal resistance, and will significantly increase the thermal resistance of the whole package. Furthermore, due to different amounts of the compliant material applied to each die (for even height of each die), the increase of thermal resistance for each die will be different.

Accordingly, there remains a need for improved semiconductor package designs to accommodate the increased heat generation of high performance dies and to avoid using the compliant material between the interface of each die and the heat spreader.

SUMMARY

The present disclosure relates to a semiconductor package with a floating heat spreader for thermally enhanced performance, and a process for applying the floating heat spreader into the semiconductor package. The disclosed semiconductor package includes a carrier having a top surface, a first flip-chip die formed over the top surface of the carrier, a mold compound, and a heat spreader. Herein, the first flip-chip die includes a first device layer over the top surface of the carrier and a first die substrate over the first device layer. The mold compound resides over the top surface of the carrier and surrounds the first flip-chip die. The mold compound has a first recess adjacent to the first flip-chip die, and the first recess extends vertically lower than a top surface of the first die substrate. The heat spreader, which includes a spreader body and a first spreader protrusion, hangs over the first flip-chip die. The spreader body is thermally coupled to the top surface of the first die substrate, and the first spreader protrusion extends from the spreader body into the first recess. A thickness of the first spreader protrusion is shorter than a depth of the first recess, and a width of the first spreader protrusion is narrower than a width of the first recess, such that the first spreader protrusion is floating in the first recess.

According to another embodiment, the semiconductor package further includes a second flip-chip die formed over the top surface of the carrier. Herein, the second flip-chip die includes a second device layer over the top surface of the carrier and a second die substrate over the second device layer. A top surface of the second die substrate and the top surface of the first die substrate are at a same plane. The mold compound surrounds the second flip-chip die and further includes a second recess horizontally between the first flip-chip die and the second flip-chip die. The second recess extends vertically lower than the top surface of the second die substrate. In addition, the heat spreader further includes a second spreader protrusion extending from the spreader body into the second recess. The spreader body is thermally coupled to the top surface of the second die substrate. A thickness of the second spreader protrusion is shorter than a depth of the second recess, and a width of the second spreader protrusion is narrower than a width of the second recess, such that the second spreader protrusion is floating in the second recess.

In one embodiment of the semiconductor package, the first recess and the second recess have a same depth.

In one embodiment of the semiconductor package, the first spreader protrusion and the second spreader protrusion have a same thickness.

In one embodiment of the semiconductor package, the first recess and the second recess have different depths.

In one embodiment of the semiconductor package, the first spreader protrusion and the second spreader protrusion have different thicknesses.

In one embodiment of the semiconductor package, the mold compound fully covers side surfaces of the first device layer and fully covers side surfaces of the second device layer.

In one embodiment of the semiconductor package, the mold compound fully covers side surfaces of the first flip-chip die and fully covers side surfaces of the second flip-chip die.

In one embodiment of the semiconductor package, the heat spreader has a thermal conductivity greater than 35 w/m·k.

In one embodiment of the semiconductor package, the heat spreader is formed of copper or ceramic.

In one embodiment of the semiconductor package, the mold compound is formed of Silicone based material or epoxy based material.

According to another embodiment, the semiconductor package further includes thermal grease formed between the top surface of the first die substrate and the spreader body.

In one embodiment of the semiconductor package, the depth of the first recess is between 0.01 mm and 5 mm, and the thickness of the first spreader protrusion is between 0.01 mm and 5 mm.

According to another embodiment, the semiconductor package is included in a system assembly. Besides the semiconductor package, the system assembly also includes a heat sink residing over the heat spreader.

According to another embodiment, the system assembly also further includes a thermal interface layer formed between the heat spreader and the heat sink. Herein, the thermal interface layer is formed of thermal grease or thermally conductive gasket material.

According to an exemplary process for making a semiconductor package, a first intact flip-chip die and a second intact flip-chip die are initially formed over a top surface of a carrier. Herein, the first intact flip-chip die includes a first device layer over the top surface of the carrier and a first intact die substrate over the first device layer, and the second intact flip-chip die includes a second device layer over the top surface of the carrier and a second intact die substrate over the second device layer. Next, a mold compound is applied over the top surface of a carrier to encapsulate the first intact flip-chip die and the second intact flip-chip die individually. The mold compound includes an intact recess horizontally between the first intact flip-chip die and the second intact flip-chip die, and the recess extends vertically lower than a top surface of the first intact die substrate and vertically lower than a top surface of the second intact die substrate. The mold compound is then thinned down to provide a first flip-chip die and a second flip-chip die with a same height. Herein, the first flip-chip die includes the first device layer and a first die substrate thinned from the first intact die substrate. The second flip-chip die includes the second device layer and a second die substrate thinned from the second intact die substrate. A top surface of the first die substrate and a top surface of the second die substrate are at a same plane and exposed through the mold compound. In addition, the intact recess of the mold compound is shallowed to a recess, which extends vertically lower than the top surface of the first die substrate and vertically lower than the top surface of the second die substrate. Finally, a heat spreader is placed over the first flip-chip die and the second flip-chip die. The heat spreader includes a spreader body and a spreader protrusion extending from the spreader body into the recess of the mold compound. The spreader body is thermally coupled to the top surface of the first die substrate and thermally coupled to the top surface of the second die substrate. A thickness of the spreader protrusion is shorter than a depth of the recess, and a width of the spreader protrusion is narrower than a width of the recess, such that the spreader protrusion is floating in the recess.

In one embodiment of the exemplary process for making a semiconductor package, the first intact flip-chip die and the second intact flip-chip die have different heights.

In one embodiment of the exemplary process for making a semiconductor package, thinning down the mold compound is provided by a mechanical grinding process.

In one embodiment of the exemplary process for making a semiconductor package, after thinning down the mold compound, the mold compound covers side surfaces of the first flip-chip die and side surfaces of the second flip-chip die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1A-3E may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
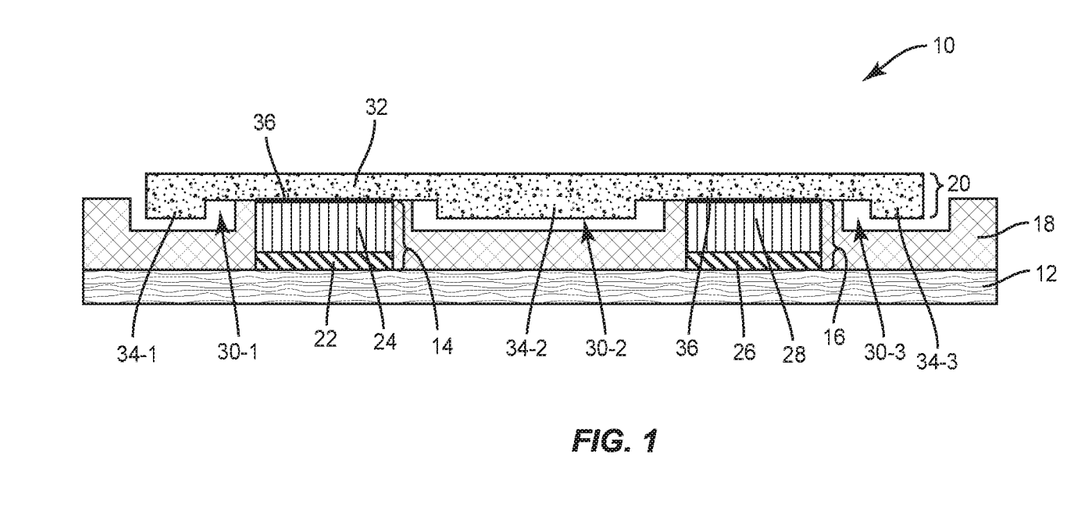
FIG. 1 provides an exemplary semiconductor package with a floating heat spreader according to one embodiment of the present disclosure.

FIG. 1 provides an exemplary semiconductor package 10 according to one embodiment of the present disclosure. For the purpose of this illustration, the semiconductor package 10 includes a carrier 12, a first flip-chip die 14, a second flip-chip die 16, a mold compound 18, and a heat spreader 20. The first flip-chip die 14 and the second flip-chip die 16 are placed over a top surface of the carrier 12. The mold compound 18 resides over the top surface of the carrier 12 and surrounds the first flip-chip die 14 and the second flip-chip die 16 individually. The heat spreader 20 hangs over the first flip-chip die 14 and the second flip-chip die 16. In different applications, the semiconductor package 10 may include fewer or more flip-chip dies, and the heat spreader 20 may hang over all of flip-chip dies or some of flip-chip dies included in the semiconductor package 10.

In detail, the carrier 12 may be formed from a laminate, a wafer level fan out (WLFO) carrier, a lead frame, a ceramic carrier, or the like. The first flip-chip die 14 includes a first device layer 22 formed over the top surface of the carrier 12 and a first die substrate 24 formed over the first device layer 22. Electrical components (not shown) are integrated in the first device layer 22, but not in the first die substrate 24. Similarly, the second flip-chip die 16 includes a second device layer 26 formed over the top surface of the carrier 12 and a second die substrate 28 formed over the second device layer 26. Electrical components (not shown) are integrated in the second device layer 26, but not in the second die substrate 28. The first flip-chip die 14 and the second flip-chip die 16 have a same height, such that a top surface of the first die substrate 24 and a top surface of the second die substrate 28 are at a same plane. In some applications, there may be other layers, such as a buried oxide layer and/or a silicon nitride layer, between the first device layer 22 and the first die substrate 24, and/or between the second device layer 26 and the second die substrate 28.

The mold compound 18 may be formed of Silicone based mold material or epoxy based mold material. Herein, the mold compound 18 does not cover any portion of the top surface of the first die substrate 24 or any portion of the top surface of the second die substrate 28. The mold compound 18 at least covers side surfaces of the first device layer 22 and side surfaces of the second device layer 26. In one embodiment, the mold compound 18 may fully cover side surfaces of the first flip-chip die 14 and side surfaces of the second flip-chip die 16.

The mold compound 18 includes one or more recesses 30 adjacent to the first flip-chip die 14 and/or the second flip-chip die 16. For the purpose of this illustration, the mold compound 18 has a first recess 30-1 adjacent to the first flip-chip die 14, a second recess 30-2 between the first flip-chip die 14 and the second flip-chip die 16, and a third recess 30-3 adjacent to the second flip-chip die 16. The first recess 30-1, the second recess 30-2, and the third recess 30-3 extend lower than the top surface of the first/second die substrate 24/28. The first recess 30-1, the second recess 30-2, and the third recess 30-3 may have a same depth or different depths. In different applications, the mold compound 18 may include fewer or more recesses. For instance, the mold compound 18 may only include the second recess 30-2 between the first flip-chip die 14 and the second flip-chip die 16, and the first and third recesses 30-1 and 30-3 are omitted.

The heat spreader 20 includes a spreader body 32 and one or more spreader protrusions 34 extending from the spreader body 32 into corresponding recess(es) 30 within the mold compound 18. In this embodiment, the heat spreader 20 includes a first spreader protrusion 34-1, a second spreader protrusion 34-2, and a third spreader protrusion 34-3 extending in to the first recess 30-1, the second recess 30-2, and the third recess 30-3, respectively. The first spreader protrusion 34-1, the second spreader protrusion 34-2, and the third spreader protrusion 34-3 may have a same thickness or different thicknesses (due to the depths of the corresponding recesses). Herein, a thickness of each spreader protrusion 34 may be shorter than the depth of the corresponding recess 30, such that each spreader protrusion 34 does not touch the bottom surface of the corresponding recess 30. In one embodiment, the thickness of each spreader protrusion 34 is between 0.01 mm and 5 mm, and the depth of the corresponding recess 30 is between 0.01 mm and 5 mm. A width of each spreader protrusion 34 is narrower than the width of the corresponding recess 30. As such, each spreader protrusion 34 is floating in the corresponding recess 30.

The heat spreader 20 may be formed of a thermal material with a thermal conductivity greater than 35 w/m·k, such as copper or ceramic. The spreader body 32 is thermally coupled to the first flip-chip die 14 and the second flip-chip die 16. In some applications, the spreader body 32 is directly in contact with both the top surface of the first die substrate 24 and the top surface of the second die substrate 28, since the top surface of the first die substrate 24 and the top surface of the second die substrate 28 are not covered by the mold compound 18 and are at a same plane. In some applications, the spreader body 32 is coupled to the first/second die substrate 24/28 via a thermal grease 36, which is configured to enhance adhesion between the first/second die substrate 24/26 and the spreader body 32.

Herein, the heat spreader 20 may not be fixed to the first flip-chip die 14 or the second flip-chip die 16, and may slide horizontally. However, since the spreader protrusions 34 extend into the recesses 30, the heat spreader 20 is only able to slide within a certain small range (due to the widths of the recesses 30). As such, the spreader body 32 is always connected to (with or without the thermal grease 36) the top surface of the first die substrate 24 and the top surface of the second die substrate 28, and always thermally coupled to the first flip-chip die 14 and the second flip-chip die 16.

Figure 2:
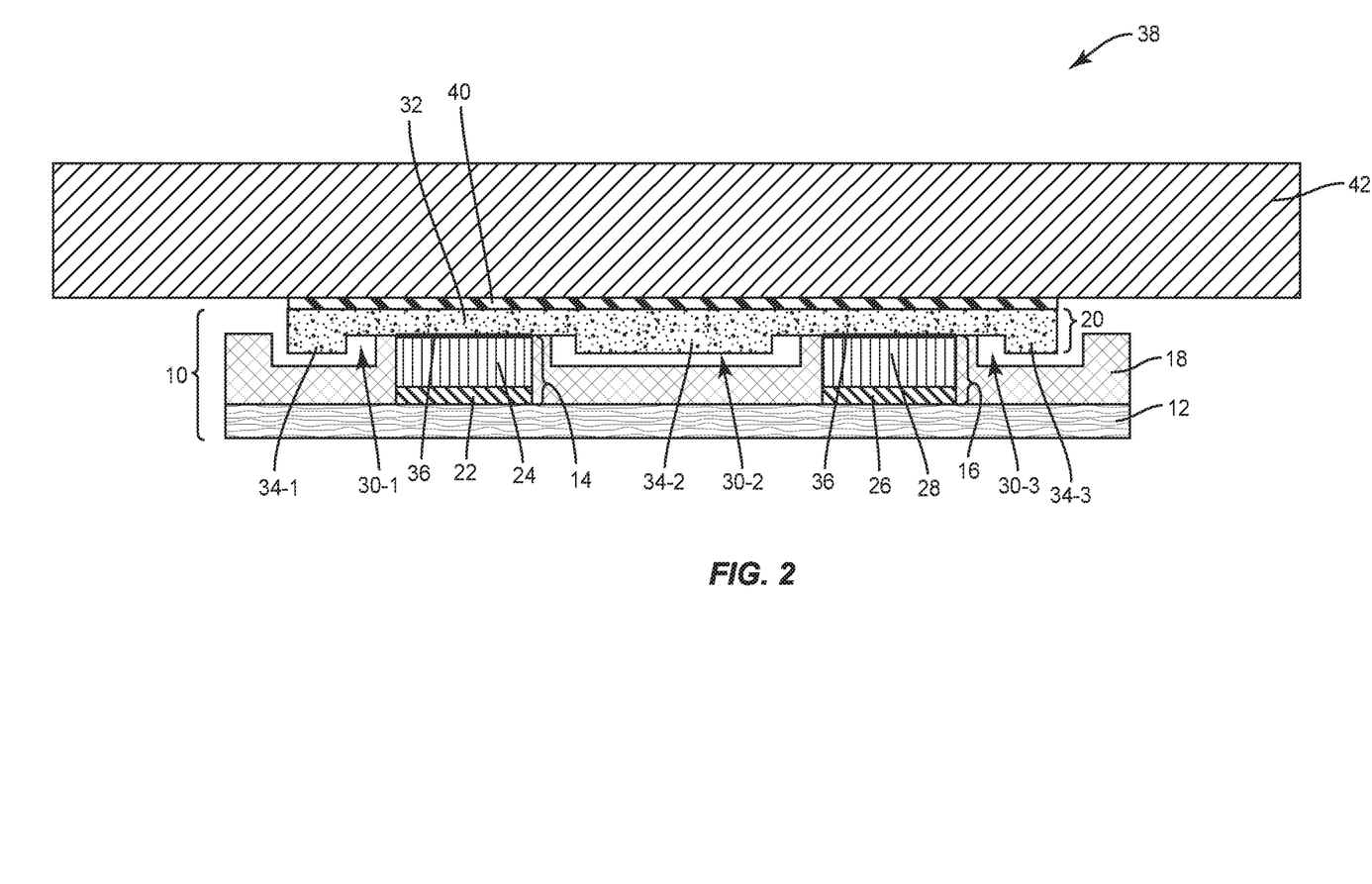
FIG. 2 provides an exemplary system assembly including the exemplary semiconductor package shown in FIG. 1.

FIG. 2 provides an exemplary system assembly 38 including the semiconductor package 10 shown in FIG. 1. Besides the semiconductor package 10, the system assembly 38 also includes a thermal interface layer 40 and a heat sink 42. The thermal interface layer 40 resides over the spreader body 32 of the heat spreader 20, and may be formed of thermal grease or thermally conductive gasket material. The heat sink 42 resides over the thermal interface layer 40. Herein, the thermal interface layer 40 provides adhesion and thermal transition between the heat spreader 20 and the heat sink 42.

FIGS. 3A-3E illustrate an exemplary process to form the exemplary semiconductor package 10 shown in FIG. 1 according to one embodiment of the present disclosure. Although the exemplary process is illustrated as a series of sequential steps, the exemplary process is not necessarily order dependent. Some operations may be done in a different order than that presented. Further, processes within the scope of this disclosure may include fewer or more operations than those illustrated in FIGS. 3A-3E.

Figure 3A:
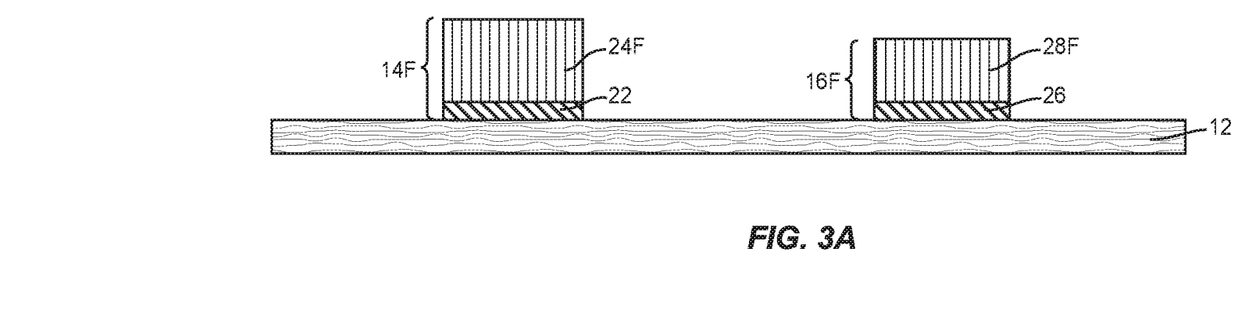
FIGS. 3A-3E illustrate an exemplary process to form the exemplary system assembly shown in FIG. 2 according to one embodiment of the present disclosure.

Initially, a first intact flip-chip die 14F and a second intact flip-chip die 16F are placed over the top surface of the carrier 12, as illustrated in FIG. 3A. In different applications, there might be fewer or more intact flip-chip dies placed over the top surface of the carrier 12. Herein, the first intact flip-chip die 14F includes the first device layer 22 formed over the top surface of the carrier 12 and a first intact die substrate 24F formed over the first device layer 22. Electrical components (not shown) are integrated in the first device layer 22, but not in the first intact die substrate 24F. Similarly, the second intact flip-chip die 16F includes the second device layer 26 formed over the top surface of the carrier 12 and a second intact die substrate 28F formed over the second device layer 26. Electrical components (not shown) are integrated in the second device layer 26, but not in the second intact die substrate 28F. The first intact flip-chip die 14F and the second intact flip-chip die 16F may have a same height or different heights. As such, a top surface of the first intact die substrate 24F and a top surface of the second intact die substrate 28F may or may not be at a same plane. Note that a height of the first intact flip-chip die 14F must be taller than a height of the second device layer 26, and a height of the second intact flip-chip die 16F must be taller than a height of the first device layer 22. In some applications, there may be other layers, such as a buried oxide layer and/or a silicon nitride layer, between the first device layer 22 and the first intact die substrate 24F, and/or between the second device layer 26 and the second intact die substrate 28.

Figure 3B:
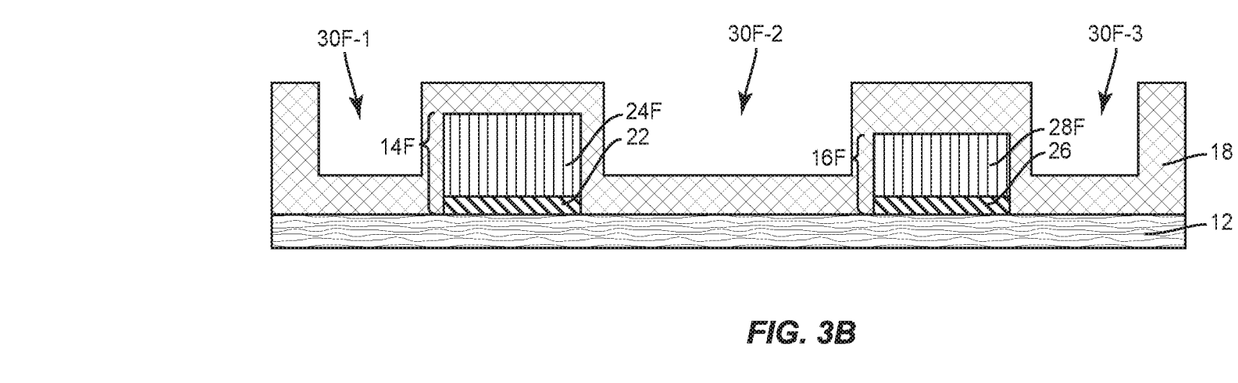

Next, the mold compound 18 is applied over the top surface of the carrier 12 to encapsulate the first intact flip-chip die 14F and the second intact flip-chip die 16F as illustrated in FIG. 3B. The mold compound 18 may be applied by various procedures, such as sheet molding, overmolding, compression molding, transfer molding, dam fill encapsulation, or screen print encapsulation. The mold compound 18 includes one or more intact recesses 30F adjacent to the first intact flip-chip die 14F and/or the second intact flip-chip die 16F. For the purpose of this illustration, the mold compound 18 has a first intact recess 30E-1 adjacent to the first intact flip-chip die 14F, a second intact recess 30E-2 between the first intact flip-chip die 14F and the second intact flip-chip die 16F, and a third intact recess 30E-3 adjacent to the second intact flip-chip die 16F. Each intact recess 30F extends lower than both the top surface of the first intact die substrate 24F and the top surface of the second intact die substrate 28F. The first intact recess 30E-1, the second intact recess 30E-2, and the third intact recess 30E-3 may have a same depth or different depths. A curing process (not shown) is followed to harden the mold compound 18. The curing temperature is between 100° C. and 320° C. depending on which material is used as the mold compound 18.

Figure 3C:
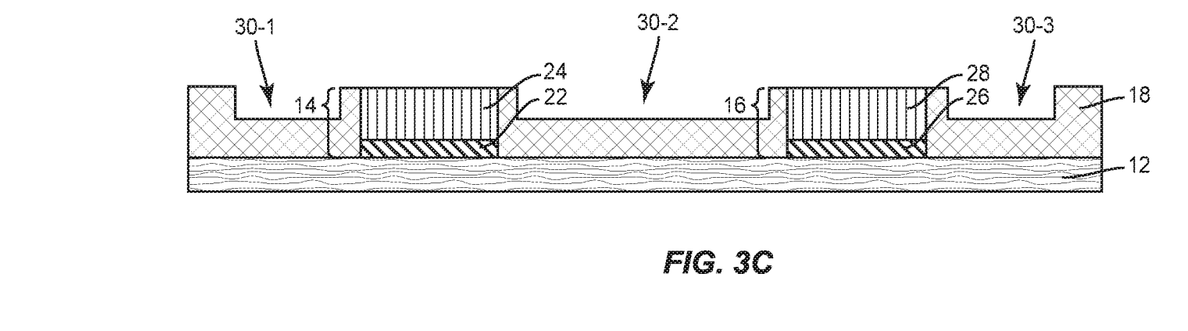

The mold compound 18 is then thinned down, until the first and second flip-chip dies 14 and 16 are provided with the same height, as illustrated in FIG. 3C. Herein, the first flip-chip die 14 includes the first device layer 22 and the first die substrate 24 thinned down from the first intact die substrate 24F. The second flip-chip die 26 includes the second device layer 26 and the second die substrate 28 thinned down from the second intact die substrate 28F. After the thinning process, the mold compound 18 covers the side surfaces of the first flip-chip die 14 and the side surfaces of the second flip-chip die 16, but not the top surface of the first die substrate 24 or the top surface of the second die substrate 28.

The first die substrate 24 and the second die substrate 28 may have different heights (due to different heights of the device layers 22 and 26), but the top surface of the first die substrate 24 and the top surface of the second die substrate 28 are at a same plane and exposed through the mold compound 18. Note that since the height of the first intact flip-chip die 14F is taller than the height of the second device layer 26, and the height of the second intact flip-chip die 16F is taller than the height of the first device layer 22, the first die substrate 24 and the second die substrate 28 will be both exposed before either of the device layers 22 and 26 are exposed. Therefore, the first device layer 22 and the second device layer 26 will not be exposed and are always protected from exterior environments. In addition, after the mold compound 18 is thinned down, the first intact recess 30E-1 within the mold compound 18 is shallowed to the first recess 30-1, the second intact recess 30E-2 within the mold compound 18 is shallowed to the second recess 30-2, and the third intact recess 30E-3 within the mold compound 18 is shallowed to the third recess 30-3. Each of the first, second and third recesses 30 extends vertically lower than the top surface of the first die substrate 24 and vertically lower than the top surface of the second die substrate 28. The thinning procedure may be done with a mechanical grinding process.

Figure 3D:
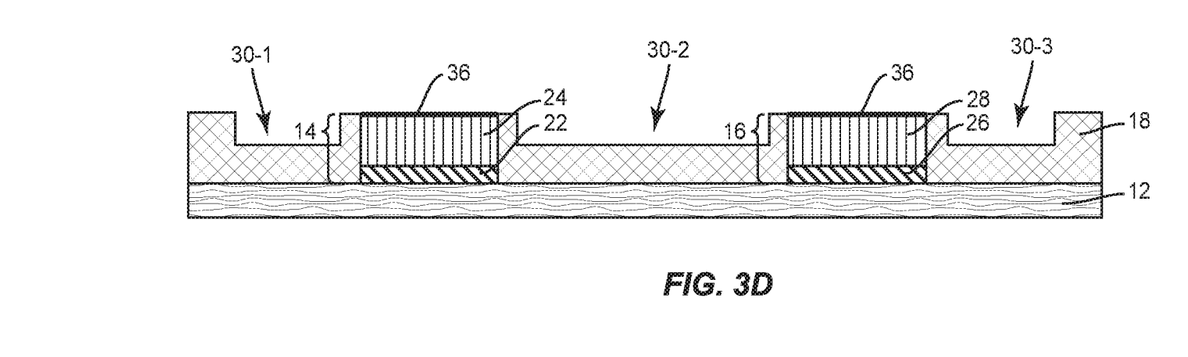
Figure 3E:
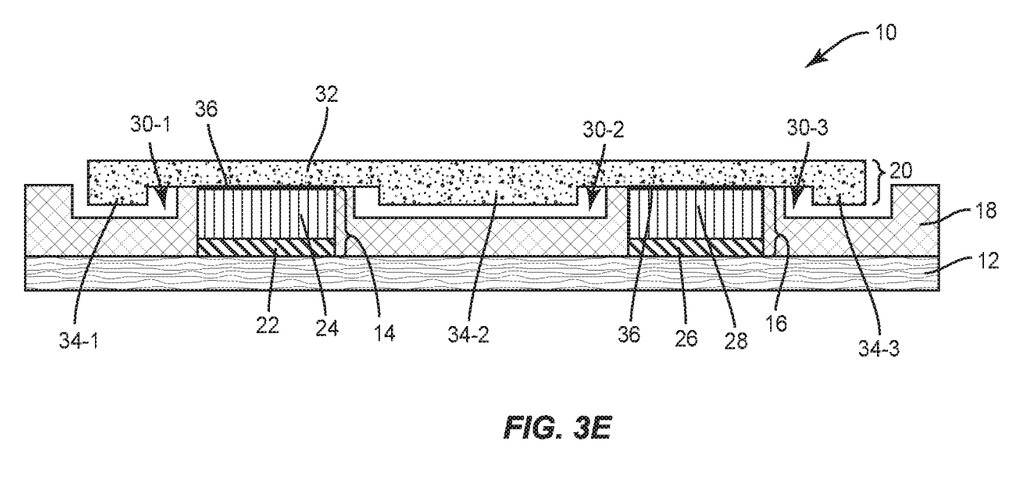

In some applications, the thermal grease 36 may be applied at the top surface of the first die substrate 24 and the top surface of the second die substrate 28, as illustrated in FIG. 3D. Finally, the heat spreader 20 is placed over the first flip-chip die 14 and the second flip-chip die 16, as illustrated in FIG. 3E. Herein, the thermal grease 36 is configured to enhance adhesion between the first die substrate 24 and the heat spreader 20, and between the second die substrate 28 and the heat spreader 20. In some applications, there is no thermal grease 36 between the first die substrate 24 and the heat spreader 20, or between the second die substrate 28 and the heat spreader 20.

The heat spreader 20 includes the spreader body 32 and three spreader protrusions 34 extending from the spreader body 32 into corresponding recesses 30 within the mold compound 18. The spreader body 32 is thermally coupled to the first flip-chip die 14 at the first die substrate 24, and thermally coupled to the second flip-chip die 16 at the second die substrate 28. The first spreader protrusion 34-1, the second spreader protrusion 34-2, and the third spreader protrusion 34-3 may have a same thickness or different thicknesses (due to the depth of the corresponding recess). Herein, the thickness of each spreader protrusion 34 is shorter than the depth of the corresponding recess 30. The width of each spreader protrusion 34 is narrower than the width of the corresponding recess 30. As such, each spreader protrusion 34 is floating in the corresponding recess 30.

In addition, the heat spreader 20 may not be fixed to the first flip-chip die 14 or the second flip-chip die 16, and may slide horizontally. However, since the spreader protrusions 34 extend into the recesses 30, the heat spreader 20 is only able to slide a certain small range (due to the widths of the recesses 30). As such, the spreader body 32 is always connected to (with or without the thermal grease 36) the top surface of the first die substrate 24 and the top surface of the second die substrate 28, and always thermally coupled to the first flip-chip die 14 and the second flip-chip die 16.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
    providing a precursor package, which includes a carrier, a first flip-chip die, a second flip-chip die, and a mold compound, wherein:
        the first flip-chip die and the second flip-chip die are formed over a top surface of the carrier;
        the mold compound is applied over the top surface of the carrier, and encapsulates side walls of the first flip-chip die and side walls of the second flip-chip die, wherein a top surface of a first die substrate of the first flip-chip die and a top surface of a second die substrate of the second flip-chip die are at a same plane as a top surface of the mold compound, and exposed through the mold compound; and
        the mold compound comprises a recess between the first flip-chip die and the second flip-chip die, wherein the recess extends vertically from the top surface of the mold compound toward a bottom surface of the mold compound, and is vertically lower than the top surface of the first die substrate and vertically lower than the top surface of the second die substrate;
    placing a heat spreader, which includes a spreader body and a spreader protrusion, over the precursor package, wherein:
        the spreader protrusion extends from the spreader body into the recess of the mold compound, and the spreader body is thermally coupled to the top surface of the first die substrate and thermally coupled to the top surface of the second die substrate; and
        a thickness of the spreader protrusion is shorter than a depth of the recess, and a width of the spreader protrusion is narrower than a width of the recess, such that the spreader protrusion is floating in the recess.

2. The method of claim 1 further comprising applying thermal grease on the top surface of the first die substrate and the top surface of the second die substrate before placing the heat spreader.

3. The method of claim 1 wherein providing the precursor package comprises:
    forming a first intact flip-chip die and a second intact flip-chip die over the top surface of the carrier, wherein the first intact flip-chip die comprises a first device layer over the top surface of the carrier and a first intact die substrate over the first device layer, and the second intact flip-chip die comprises a second device layer over the top surface of the carrier and a second intact die substrate over the second device layer;
    applying the mold compound over the top surface of the carrier to encapsulate the first intact flip-chip die and the second intact flip-chip die individually, wherein:
        the mold compound comprises an intact recess horizontally between the first intact flip-chip die and the second intact flip-chip die, and
        the intact recess extends vertically lower than a top surface of the first intact flip-chip die and vertically lower than a top surface of the second intact flip-chip die; and
    thinning down the mold compound to provide the precursor package with the first flip-chip die and the second flip-chip die, wherein:
        the first flip-chip die is thinned from the first intact flip-chip die, and comprises the first device layer and a first die substrate thinned from the first intact die substrate; and
        the second flip-chip die is thinned from the second intact flip-chip die, and comprises the second device layer and a second die substrate thinned from the second intact die substrate, wherein the first flip-chip die and the second flip-chip die have a same height; and
        the intact recess of the mold compound is shallowed to the recess, which extends vertically lower than the top surface of the first die substrate and vertically lower than the top surface of the second die substrate.

4. The method of claim 3 wherein the first intact flip-chip die and the second intact flip-chip die have different heights.

5. The method of claim 3 wherein thinning down the mold compound is provided by a mechanical grinding process.

6. The method of claim 1 wherein:
    the recess within the mold compound is a first recess, and the mold compound further comprises a second recess adjacent to the first flip-chip die, wherein the second recess extends vertically lower than the top surface of the first die substrate; and
    the spreader protrusion of the heat spreader is a first spreader protrusion, and the heat spreader further includes a second spreader protrusion extending from the spreader body into the second recess, wherein a thickness of the second spreader protrusion is shorter than a depth of the second recess, and a width of the second spreader protrusion is narrower than a width of the second recess, such that the second spreader protrusion is floating in the second recess.

7. The method of claim 6 wherein the first recess and the second recess have a same depth.

8. The method of claim 7 wherein the first spreader protrusion and the second spreader protrusion have a same thickness.

9. The method of claim 6 wherein the first recess and the second recess have different depths.

10. The method of claim 9 wherein the first spreader protrusion and the second spreader protrusion have different thicknesses.

11. The method of claim 6 wherein:
    the depth of the first recess is between 0.01 mm and 5 mm, and the thickness of the first spreader protrusion is between 0.01 mm and 5 mm; and
    the depth of the second recess is between 0.01 mm and 5 mm, and the thickness of the second spreader protrusion is between 0.01 mm and 5 mm.

12. The method of claim 1 wherein the depth of the recess is between 0.01 mm and 5 mm, and the thickness of the spreader protrusion is between 0.01 mm and 5 mm.

13. The method of claim 1 wherein the heat spreader has a thermal conductivity greater than 35 w/m·k.

14. The method of claim 13 wherein the heat spreader is formed of copper or ceramic.

15. The method of claim 1 wherein the mold compound is formed of Silicone based material or epoxy based material.

* * * * *

UNITED STATES PATENT AND TRADEMARK OFFICE
CERTIFICATE OF CORRECTION

PATENT NO. : 11,244,884 B2  
APPLICATION NO. : 16/925517  
DATED : February 8, 2022  
INVENTOR(S) : Robert Charles Dry Page 1 of 1

It is certified that error appears in the above-identified patent and that said Letters Patent is hereby corrected as shown below:

In the Specification

Column 7, Lines 49 and 56, replace "30E-1" with --30F-1--.
Column 7, Lines 51 and 57, replace "30E-2" with --30F-2--.
Column 7, Lines 53 and 58, replace "30E-3" with --30F-3--.
Column 8, Line 23, replace "30E-1" with --30F-1--.
Column 8, Line 25, replace "30E-2" with --30F-2--.
Column 8, Line 27, replace "30E-3" with --30F-3--.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*